(12) United States Patent
Yang et al.

(10) Patent No.: US 12,419,009 B2
(45) Date of Patent: Sep. 16, 2025

(54) COOLING DEVICE AND ELECTRONIC DEVICE

(71) Applicant: SHENZHEN ENVICOOL TECHNOLOGY CO., LTD., Guangdong (CN)

(72) Inventors: Xi Yang, Guangdong (CN); Zhao Lu, Guangdong (CN); Kailun Zhang, Guangdong (CN); Weiyang Lai, Guangdong (CN); Lichuan Wei, Guangdong (CN); Zhiqiang Cai, Guangdong (CN)

(73) Assignee: SHENZHEN ENVICOOL TECHNOLOGY CO., LTD., Guangdong (CN)

( * ) Notice: Subject to any disclaimer, the term of this patent is extended or adjusted under 35 U.S.C. 154(b) by 240 days.

(21) Appl. No.: 17/738,038

(22) Filed: May 6, 2022

(65) Prior Publication Data

US 2022/0369507 A1    Nov. 17, 2022

(30) Foreign Application Priority Data

May 17, 2021   (CN) .......................... 202121095230.2

(51) Int. Cl.
*H05K 7/20*    (2006.01)
(52) U.S. Cl.
CPC ..... *H05K 7/20254* (2013.01); *H05K 7/20272* (2013.01)
(58) Field of Classification Search
CPC ........... H05K 7/20272; H05K 7/20254; H05K 7/20327; H05K 7/20809; H05K 7/20772; H05K 7/20927; H05K 7/20218; H05K 1/0203; H05K 7/20263; H05K 7/20281; H05K 7/20154; F28F 9/02; F28F 3/12;
(Continued)

(56) References Cited

U.S. PATENT DOCUMENTS 7,182,125 B2* 2/2007 Martin .................. F28D 1/0383
                                                    165/170
9,157,685 B2* 10/2015 Dixon ....................... F28G 1/02
(Continued)

FOREIGN PATENT DOCUMENTS

WO    2017036292 A1    3/2017

OTHER PUBLICATIONS

The European Search Report issued on Sep. 23, 2022 for EP22165917.0.

*Primary Examiner* — Adam B Dravininkas
(74) *Attorney, Agent, or Firm* — Yue (Robert) Xu; Apex Attorneys at Law, LLP

(57) ABSTRACT

A cooling device includes a cooling plate and a buffer portion, a flow passage is formed in the cooling plate, and the buffer portion is arranged on the cooling plate. An inlet buffer zone and an outlet buffer portion are defined in the buffer portion, liquid flows into the flow passage through the inlet buffer zone and flows out of the flow passage through the outlet buffer portion. The liquid flows into the flow passage through the buffer portion, and the buffer portion can reduce the flow resistance of the liquid flowing into the flow passage. The liquid in the flow passage also flows out through the buffer portion, and the buffer portion can also reduce the flow resistance of the liquid flowing out of the flow passage.

6 Claims, 3 Drawing Sheets

(58) Field of Classification Search
CPC ... F28F 9/26; F28F 9/0278; F28F 9/00; F28D 7/16; F28D 15/0266; F28D 15/00; F28D 9/0006
See application file for complete search history.

(56) References Cited

U.S. PATENT DOCUMENTS

| | | |
|---|---|---|
| 10,440,864 B2 | 10/2019 | Hayashi |
| 2002/0079095 A1* | 6/2002 | Davies ................. F28F 9/0278 165/170 |
| 2007/0029064 A1* | 2/2007 | Baginski .............. F28D 20/021 165/10 |
| 2007/0084585 A1* | 4/2007 | Takagi ................. H01L 23/473 257/E23.098 |
| 2009/0211743 A1* | 8/2009 | Schrader .............. F28F 9/0221 165/173 |
| 2011/0120686 A1* | 5/2011 | Zoch .................... F28D 7/1638 165/173 |
| 2017/0254573 A1* | 9/2017 | Numata ................. F25B 43/00 |
| 2017/0347486 A1* | 11/2017 | Schaltz ............. H05K 7/20272 |
| 2018/0087842 A1* | 3/2018 | Chainer ............... H01L 23/473 |
| 2019/0063847 A1* | 2/2019 | Bungo .................... F28D 9/02 |

* cited by examiner

COOLING DEVICE AND ELECTRONIC DEVICE

CROSS REFERENCE TO RELATED APPLICATIONS

This application claims the priorities to Chinese patent application No. 202121095230.2, titled "COOLING DEVICE AND ELECTRONIC DEVICE", filed with the China National Intellectual Property Administration May 17, 2021, the entire disclosure of which is hereby incorporated by reference.

FIELD

The present application relates to the technical field of electronic devices, and in particular to a cooling device.

BACKGROUND

In recent years, liquid cooling has gradually been favored by the market and has become one of the mainstream developments in the field of electronic heat dissipation. In an electronic computing device, a heat source with small power is cooled by air, and a heat source with large power is cooled by liquid. For a whole system, the complexity of the system is inevitably increased by using two cooling system. In an existing liquid cooling device, an external liquid pipeline is directly connected to a cooling plate, thus the liquid may collide with an inner wall of the cooling plate and encounter flow resistance when it flows to the cooling plate from the pipeline. In addition, the cooling plate has a diameter of the corresponding pipeline, and a thickness of the cooling plate is larger than a diameter of the connecting pipeline, which causes a large thickness of the cooling plate and reduces cooling rate. Therefore, it is necessary to design a liquid cooling device with a simple structure.

SUMMARY

A cooling device and an electronic device are provided according to the present application, which aims to ensure the temperature control of the electronic device, and reduce the flow resistance of the liquid inside a cooling plate while the thinning design of the cooling plate is realized and the manufacturing cost is saved.

A cooling device is provided according to the present application, includes:
  a cooling plate, in which a flow passage is formed;
  a buffer portion arranged on the cooling plate;
  and an inlet buffer zone and an outlet buffer zone are defined in the buffer portion, liquid flows into the flow passage through the inlet buffer zone, and flows out of the flow passage through the outlet buffer zone.

Optionally, the cooling device further includes a water inlet pipe and a water outlet pipe, the water inlet pipe is in communication with the inlet buffer zone, and the water outlet pipe is in communication with the outlet buffer zone.

Optionally, the water inlet pipe and the water outlet pipe are located on a same side of the cooling plate, the inlet buffer zone and the outlet buffer zone are located on a same side of the cooling plate, and the outlet buffer zone is spaced apart from the inlet buffer zone.

Optionally, a first right-angle passage is formed between the water inlet pipe and the inlet buffer zone, and a second right-angle passage is formed between the inlet buffer zone and the flow passage.

Optionally, a third right-angle passage is formed between the outlet buffer zone and the flow passage, and a fourth right-angle passage is formed between the water outlet pipe and the outlet buffer zone.

Optionally, a diameter of the inlet buffer zone is larger than a diameter of the water inlet pipe, and a diameter of the outlet buffer zone is larger than a diameter of the water outlet pipe.

Optionally, the water inlet pipe and the water outlet pipe are connected to the buffer portion along a length direction of the cooling device, and the buffer portion is connected to the cooling plate along a thickness direction of the cooling device.

Optionally, along the thickness direction of the cooling device, a thickness of the buffer portion is larger than an outer diameter of the water inlet pipe and is larger than an outer diameter of the water outlet pipe.

Optionally, the flow passage includes a first buffer section and a second buffer section;
  the first buffer section is arranged close to the inlet buffer zone for buffering a pressure of the liquid flowing into the cooling plate;
  the second buffer section is arranged close to the outlet buffer zone for buffering a pressure of the liquid flowing out of the cooling plate.

Optionally, the flow passage further includes a water inlet section, a water outlet section and a cooling section, and the water inlet section, the first buffer section, the cooling section, the second buffer section and the water outlet section are in communication in a listed sequence;
  the water inlet section is corresponding to the inlet buffer zone in position, and the water outlet section is corresponding to the outlet buffer zone in position;
  in a length direction of the cooling device, the first buffer section is inclined to the cooling section relative to the water inlet section;
  in the length direction of the cooling device, the second buffer section is inclined to the cooling section relative to water outlet section.

An electronic device is further provided according to the present application, which includes:
  a cooling device, and the cooling device is the cooling device according to any one of the above.

The technical solutions provided according to the present application can achieve the following beneficial effects that: the buffer portion is provided between the water inlet pipe and the flow passage and between the flow passage and the water outlet pipe. The liquid in the water inlet pipe flows into the flow passage through the buffer portion, and the buffer portion can reduce the flow resistance of the liquid flowing into the flow passage. The liquid in the flow passage also flows to the water outlet pipe through the buffer portion, and the buffer portion can also reduce the flow resistance of the liquid flowing out of the flow passage and reduce the power loss during the liquid flow process, and further save the power lost by a power device when the liquid is driven to flow. By providing the buffer portion, the flow resistance of the liquid inside the cooling plate is reduced while the thinning design of the cooling plate is realized and the manufacturing cost is saved.

It is to be understood that the foregoing general descriptions and the following detailed descriptions are only exemplary, and cannot limit the present application.

Figure 1:
FIG. 1 is a schematic structural view of a cooling device and an electronic device provided according to a specific embodiment of the present application.

Reference numerals are as follows:
1—cooling device;
11—cooling plate;
111—flow passage;
111a—first buffer section;
111b—second buffer section;
111c—water inlet section;
111d—water outlet section;
111e—cooling section;
112—cover plate;
113—bottom plate;
12—water inlet pipe;
13—water outlet pipe;
14—buffer portion;
141—inlet buffer zone;
142—outlet buffer zone;
15—first right-angle passage;
16—second right-angle passage;
17—third right-angle passage;
18—fourth right-angle passage.

The accompanying drawings, which are incorporated herein and constitute a part of this specification, illustrate embodiments consistent with the present application and, together with the specification, serve to explain the principles of the present application.

DETAILED DESCRIPTION OF THE EMBODIMENTS

In order to better understand the technical solutions of the present application, the embodiments of the present application are described in detail below with reference to the accompanying drawings.

It is apparent that the described embodiments are only a part of the embodiments according to the present application, rather than all of the embodiments. Any other embodiments obtained by those skilled in the art based on the embodiments in the present application without any creative effort shall fall within the protection scope of the present application.

The terminology used in the present application is only for purpose of describing the specific embodiments, and is not intended to limit the present application. The terms "one", "the said", and "the" in a singular form used in the embodiments of the present application and the appended embodiments are intended to include a plural form unless other meanings are clearly indicated in the context.

It should be understood that the term "and/or" used herein is only an associated relationship for describing the associated objects, which means that there may be three kinds of relationships, for example, A and/or B may indicate three cases that A exists alone, A and B exist at the same time, or B exists alone. In addition, the character "/" in this specification indicates that the associated objects before the character "/" and after the character "/" are in an "or" relationship.

It should be noted that the locative words such as "above", "under", "left" and "right" described in the embodiments of the present application are described from angles shown in the drawings, and should not be understood as limitations on the embodiments of the present application. In addition, it should be understood herein that when an element is connected "above" or "under" another element, it can not only be directly connected "above" or "under" the another element, but also be indirectly connected "above" or "under" the another element by an intermediate element.

Figure 2:
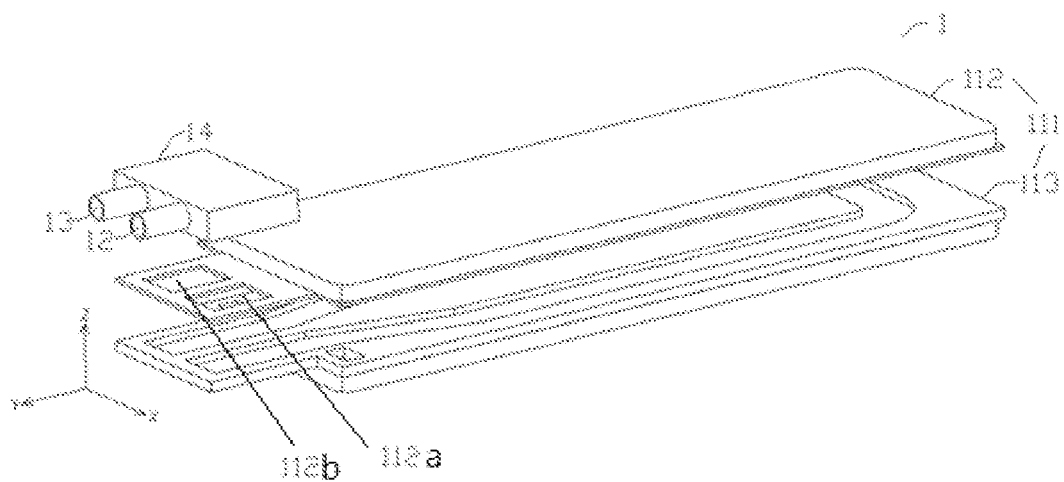
FIG. 2 is a schematic exploded view of the cooling device provided according to the present application.
Figure 3:
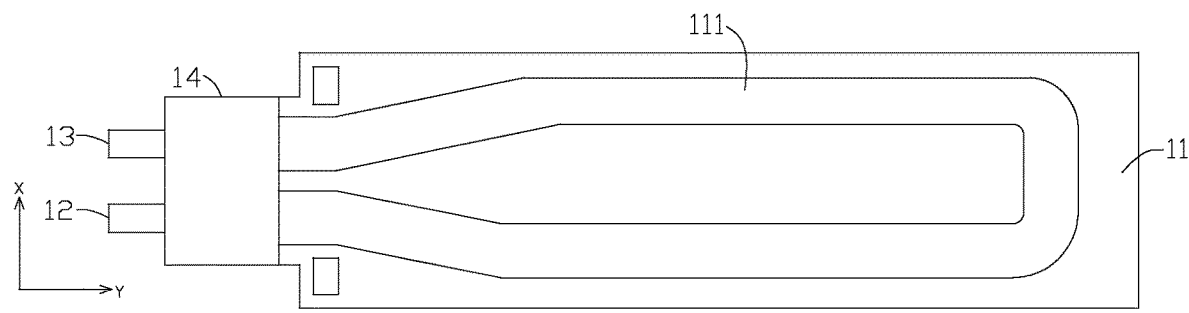
FIG. 3 is a schematic partial structural view of the cooling device provided according to the present application.

As shown in FIG. 1, an electronic device is provided according to this embodiment, the electronic device includes a cooling device 1, and the cooling device 1 is a liquid heat dissipation device. Specifically, as shown in FIG. 2 and FIG. 3, the cooling device 1 includes a cooling plate 11, a water inlet pipe 12, a water outlet 13 and a buffer portion 14. A flow passage 111 is formed in the cooling plate 11, the buffer portion 14 is arranged on the cooling plate 11, the water inlet pipe 12 and the water outlet pipe 13 are located on a same side of the cooling plate 11, and the water inlet pipe 12 and the water outlet pipe 13 are in communication with the flow passage 111 through the buffer portion 14.

In this embodiment, a buffer portion 14 is provided between the water inlet pipe 12 and the flow passage 111 and between the flow passage 111 and the water outlet pipe 13. The liquid in the water inlet pipe 12 flows into the flow passage 111 through the buffer portion 14, and the buffer portion 14 can reduce the flow resistance of the liquid flowing into the flow passage 111. The liquid in the flow passage 111 also flows into the water outlet pipe 13 through the buffer portion 14, and the buffer portion 14 can also reduce the flow resistance of the liquid flowing out of the flow passage 111 and reduce the power loss during the liquid flow process, and further save the power lost by a power device when the liquid is driven to flow. By providing the buffer portion 14, the flow resistance of the liquid inside the cooling plate 11 is reduced while the thinning design of the cooling plate is realized and the manufacturing cost is saved.

In addition, in order to reduce the risk of mutual interference between a water circuit and an electric circuit which are arranged on the cooling plate 11, in this embodiment, a water circuit interface and an electric circuit interface are distributed on two sides of the cooling plate 11. Therefore, the water inlet pipe 12 and the water outlet pipe 13 are arranged on the same side of the cooling plate 11, so as to avoid mutual interference between the water circuit and the electric circuit.

Figure 5:
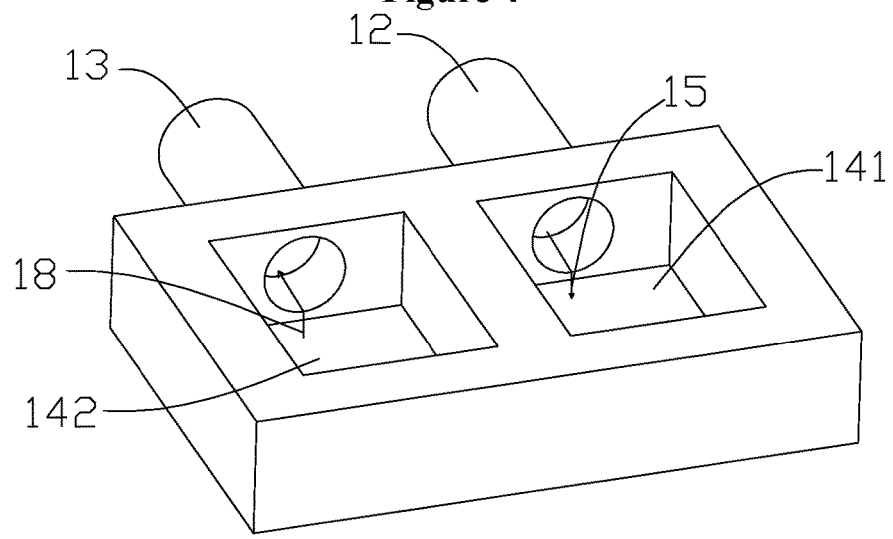
FIG. 5 is a schematic structural view of a water inlet pipe, a water outlet pipe and a buffer portion provided according to the present application.

As shown in FIG. 3 and FIG. 5, optionally, an inlet buffer zone 141 and an outlet buffer zone 142 are defined in the buffer portion 14, and the outlet buffer zone 142 is spaced apart from the inlet buffer zone 141. The water inlet pipe 12 is in communication with the flow passage 111 through the inlet buffer zone 141, and the water outlet pipe 13 is in communication with the flow passage 111 through the outlet buffer zone 142. In this embodiment, the buffer portion 14 has a chamber structure, a separation plate is provided in an inner chamber of the buffer portion 14, and separates the inner chamber into the inlet buffer zone 141 and the outlet buffer zone 142, to enable the inlet buffer zone 141 to be in communication with the water inlet pipe 12 and the flow passage 111, and the outlet buffer zone 142 to be in in communication with the water outlet pipe 13 and the flow passage 111, so that the water inlet pipe 12 and the water outlet pipe 13 can be arranged on the same side without interference with each other.

As shown in FIG. 3 and FIG. 5, optionally, the water inlet pipe 12 and the water outlet pipe 13 are connected to the buffer portion 14 along a length direction Y of the cooling device 1, and the buffer portion 14 is connected to the cooling plate 11 along a thickness direction Z of the cooling device 1. Along the thickness direction Z of the cooling device 1, a thickness of the buffer portion 14 is larger than an outer diameter of the water inlet pipe 12 and is larger than an outer diameter of the water outlet pipe 13. In this embodiment, the thickness of the buffer portion 14 is larger than the outer diameter of the water inlet pipe 12 and is larger than the outer diameter of the water outlet pipe 13, so that the water inlet pipe 12 and the water outlet pipe 13 can be connected to the buffer portion 14 along the length direction Y of the cooling device 1, which realizes horizontal arrangement of the water inlet pipe 12, the water outlet pipe 13 and the buffer portion 14, and realizes the thinning design of the cooling plate 11. If the water inlet pipe 12 and the water outlet pipe 13 are directly connected to the cooling plate 11, a thickness of the cooling plate 11 needs to be set according to diameters of the water inlet pipe 12 and the water outlet pipe 13, which increases manufacturing cost and affects the cooling effect of the cooling plate 11.

Figure 6:
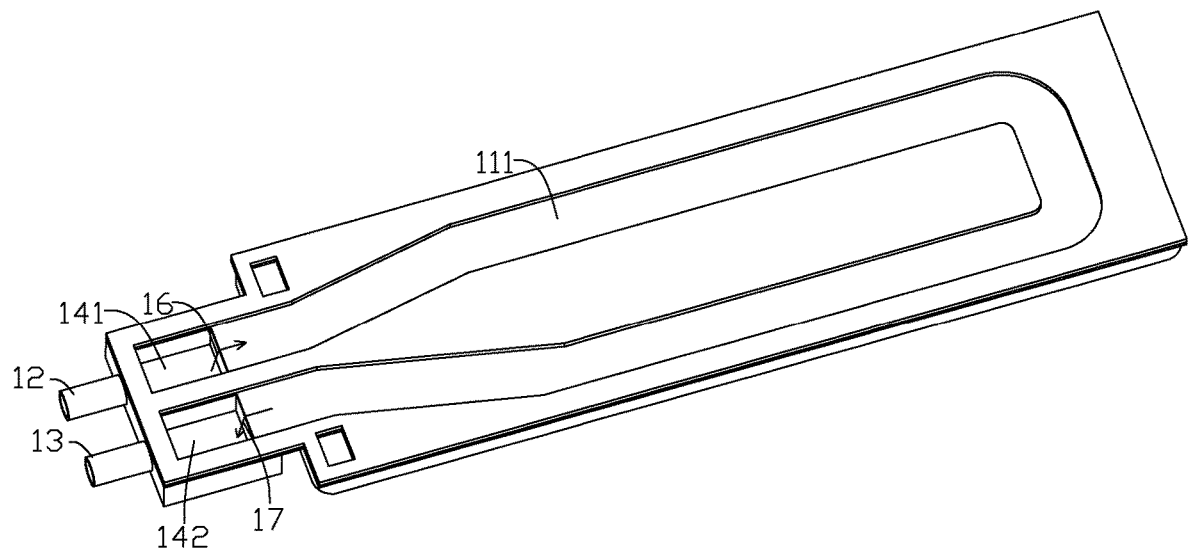
FIG. 6 is a schematic partial structural view of the cooling device provided according to the present application.

Furthermore, as shown in FIG. 3, FIG. 5 and FIG. 6, in order to realize the horizontal arrangement of the water inlet pipe 12 and the water outlet pipe 13, a first right-angle passage 15 is formed between the water inlet pipe 12 and the inlet buffer zone 141, and a second right-angle passage 16 is formed between the inlet buffer zone 141 and the flow passage 111. When the liquid flows to the flow passage 111 from the water inlet pipe 12 through the inlet buffer zone 141, it passes through a curved passage formed by two right angles of the first right-angle passage 15 and the second right-angle passage 16. A third right-angle passage 17 is formed between the outlet buffer zone 142 and the flow passage 111, and a fourth right-angle passage 18 is formed between the water outlet pipe 13 and the outlet buffer zone 142, the liquid in the flow passage 111 flows to the water outlet pipe 13 through the outlet buffer zone 142, and passes through a curved passage formed by two right angles of the third right-angle passage 17 and the fourth right-angle passage 18.

A diameter of the inlet buffer zone 141 is larger than a diameter of the water inlet pipe 13, and a diameter of the outlet buffer zone 142 is larger than a diameter of the water outlet pipe 13. In this embodiment, the diameter of the inlet buffer zone 141 is larger than the diameter of the water inlet pipe 12, which increases the flow path of the liquid flowing into the inlet buffer zone 141, and reduces the flow resistance of the liquid flowing into the flow passage 111. The diameter of the outlet buffer zone 142 is larger than the diameter of the water outlet pipe 13, which increases the flow path of the liquid flowing out of the outlet buffer zone 142, and reduces the flow resistance of the liquid flowing out of the flow passage 111.

Figure 4:
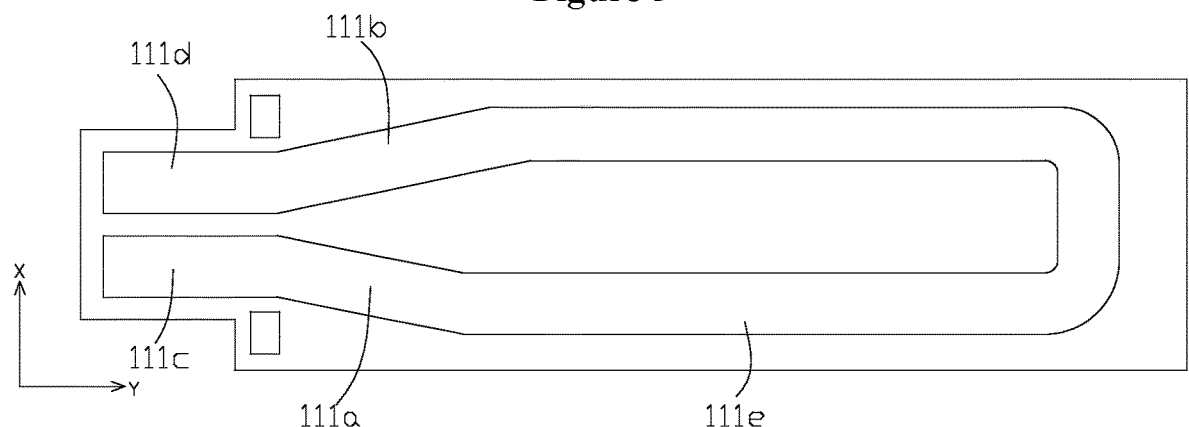
FIG. 4 is a schematic structural view of a flow passage provided according to the present application.

As shown in FIG. 4, optionally, the flow passage 111 includes a first buffer section 111a and a second buffer section 111b; the first buffer section 111a is arranged close to the inlet buffer zone 141 for buffering a pressure of the liquid flowing into the flow passage 111; the second buffer section 111b is arranged close to the outlet buffer zone 142 for buffering a pressure of the liquid flowing out of the flow passage 111.

Furthermore, as shown in FIG. 4, the flow passage 111 further includes a water inlet section 111c, a water outlet section 111d and a cooling section 111e, and the water inlet section 111c, the first buffer section 111a, the cooling section 111e, the second buffer section 111b and the water outlet section 111d are in communication in a listed sequence; the water inlet section 111c is corresponding to the inlet buffer zone 141 in position, and the water outlet section 111d is corresponding to the outlet buffer zone 142 in position; in a length direction Y of the cooling device 1, the first buffer section 111a is inclined to the cooling section 111e relative to the water inlet section 111e; in the length direction Y of the cooling device 1, the second buffer section 111b is inclined to the cooling section 111e relative to water outlet section 111d. In this embodiment, the first buffer section 111a close to the inlet buffer zone 141 is obliquely arranged, which prevents the liquid from turning at a right angle in the flow passage 111, reduces change of the flow path of the liquid in the flow passage 111 affected by the right-angle passage 111, and reduces the flow resistance of the liquid in the flow passage 111. Similarly, the second buffer section 111b close to the outlet buffer zone 142 is obliquely arranged, which prevents the liquid from turning at a right angle in the flow passage 111, reduces change of the flow path of the liquid in the flow passage 111 affected by the right-angle passage 111, and reduces the flow resistance of the liquid in the flow passage 111.

The cooling plate 11 further includes a cover plate 112 and a bottom plate 113, the cover plate 112 is covered with the bottom plate 113, a water inlet 112a and a water outlet 112b are defined on the cover plate 112, the water inlet corresponds to the water inlet section 111c, and the water outlet corresponds to the water outlet section 111d.

The foregoing is merely some embodiments of the present application and are not intended to limit the present application, and those skilled in the art can make various modifications and variations to the present application. Any modification, equivalent substitution and improvement made within the spirit and principle of the present application shall be within the scope of claims of the present application.

The invention claimed is:
1. A cooling device, comprising:
a buffer member;
a cover plate; and
a bottom plate;
wherein the buffer member and the bottom plate are respectively located at two sides of the cover plate, the cover plate is covered with the bottom plate to form a flow passage, a water inlet and a water outlet are defined on the cover plate,
wherein an inlet buffer zone and an outlet buffer zone are defined in the buffer member, liquid flows into the flow passage through the inlet buffer zone, and flows out of the flow passage through the outlet buffer zone,
wherein the buffer member further comprises a water inlet pipe and a water outlet pipe, the water inlet pipe is in communication with the inlet buffer zone, and the water outlet pipe is in communication with the outlet buffer zone,
wherein the water inlet pipe and the water outlet pipe are located on a same side of the cooling plate and are arranged in parallel in a plane of the cooling plate, the inlet buffer zone and the outlet buffer zone are located on a same side of the cooling plate, and the outlet buffer zone is spaced apart from the inlet buffer zone,
wherein a first right-angle passage is formed between the water inlet pipe and the inlet buffer zone, and a second right-angle passage is formed between the inlet buffer zone and the flow passage,
wherein a third right-angle passage is formed between the outlet buffer zone and the flow passage, and a fourth right-angle passage is formed between the water outlet pipe and the outlet buffer zone.

2. The cooling device according to claim 1, wherein the water inlet pipe and the water outlet pipe are connected to the buffer member along a length direction of the cooling device, and the buffer member is connected to the cooling plate along a thickness direction of the cooling device.

3. The cooling device according to claim 1, wherein along the thickness direction of the cooling device, a thickness of the buffer member is larger than an outer diameter of the water inlet pipe and is larger than an outer diameter of the water outlet pipe.

4. The cooling device according to claim 1, wherein the flow passage comprises a first buffer section and a second buffer section;
    the first buffer section is arranged close to the inlet buffer zone for buffering a pressure of the liquid flowing into the cooling plate;
    the second buffer section is arranged close to the outlet buffer zone for buffering a pressure of the liquid flowing out of the cooling plate.

5. The cooling device according to claim 4, wherein the flow passage further comprises a water inlet section, a water outlet section and a cooling section, and the water inlet section, the first buffer section, the cooling section, the second buffer section and the water outlet section are in communication in a listed sequence;
    the water inlet section is corresponding to the inlet buffer zone in position, and the water outlet section is corresponding to the outlet buffer zone in position;
    in a length direction of the cooling device, the first buffer section is inclined to the cooling section relative to the water inlet section;
    in the length direction of the cooling device, the second buffer section is inclined to the cooling section relative to water outlet section.

6. An electronic device comprising the cooling device according to claim 1.

* * * * *